US006409042B1

(12) United States Patent
Hirano et al.

(10) Patent No.: US 6,409,042 B1
(45) Date of Patent: Jun. 25, 2002

(54) CLOSURE OPENING/CLOSING APPARATUS OF ELECTRONICS AND ELECTRONIC APPARATUS HAVING THE SAME

(75) Inventors: Misao Hirano, Tokyo; Toshiaki Ueda, Saitama; Hiroshi Shimada, Aichi, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/472,356

(22) Filed: Dec. 23, 1999

(30) Foreign Application Priority Data

Dec. 29, 1998 (JP) .............................. 10-377525

(51) Int. Cl.[7] .......................... H01M 2/10; H05K 5/03; B65D 43/16
(52) U.S. Cl. ...................... 220/812; 220/817; 220/835; 429/100
(58) Field of Search ....................... 220/811–813, 817, 220/818, 324, 326, 835, 845; 429/96, 97, 100; 439/135

(56) References Cited

U.S. PATENT DOCUMENTS 1,623,477 A * 4/1927 Horni
3,432,967 A * 3/1969 Simon
5,206,098 A * 4/1993 Cho et al. ................... 429/100
5,372,395 A * 12/1994 Yang ........................... 429/100
5,931,513 A * 8/1999 Conti .......................... 429/100

FOREIGN PATENT DOCUMENTS

| JP | 1-225062 | * | 9/1989 |
| JP | 9-92243 | * | 4/1997 |
| JP | 10-17008 | * | 1/1998 |

* cited by examiner

Primary Examiner—Nathan J. Newhouse
(74) Attorney, Agent, or Firm—Jay H. Maioli

(57) ABSTRACT

Closure opening/closing apparatus constructed that a slide hinge (43) provided with two hinge portions (43a) and (43b) parallel to each other is supported rotatably at one hinge portion by a shaft to a closure body (41) for opening/closing an opening (21c) provided in a hardware housing (21), and a spring member (46) having coil portions (46a) and (46b) as a spring energizing section, each corresponding to the two hinge portions (43a) and (43b), is attached to the slide hinge (43). The slide hinge (43) being fitted by insertion to the hinge holder (44) formed on the hardware housing (21) slidably in the opening (21c) direction, and the closure body (41) and the slide hinge (43) are energized to pivot outward of the hardware housing (21) by the spring member (46), to thereby reverse and open the closure body (41) with respect to the hardware housing (21).

8 Claims, 11 Drawing Sheets

CLOSURE OPENING/CLOSING APPARATUS OF ELECTRONICS AND ELECTRONIC APPARATUS HAVING THE SAME

BACKGROUND OF THE INVENTION

1. Field of the Invention

The present invention relates to a closure opening/closing apparatus for opening/closing an opening of a storage section in which an insert such as a recording medium, a battery or the like is detachably inserted and stored, in electronics apparatus such as electronic still cameras, video cameras, tape recorders, radios and the like. The present invention also relates to an electronic apparatus provided with the closure opening/closing apparatus.

2. Description of the Related Art

In general, as a closure opening/closing apparatus of the electronics, for example, the one shown in FIG. 1 and FIG. 2 is known. FIGS. 1 and 2 show the main part of the electronic still camera shown as one example of the electronics. The housing of the electronic still camera 1 has a front panel 2 and a rear panel 3 superposed on each other, and an ornamental frame 4 is interposed between those panels 2 and 3. The ornamental frame 4 is fixed to the rear panel 3, while the front panel 2 and the rear panel 3 are coupled by a hinge so as to be freely opened and closed.

An opening 7 for exposing an insertion port 6 of a battery holder 5 in which a battery for the power supply is stored is provided in the rear panel 3 of the electronic still camera 1. This opening 7 is freely opened and closed by a closure body 8 having a corresponding shape. The closure body 8 is slidably supported by an arm 9 whose one end is rotatably supported by a bearing portion 5a provided on one side of the battery holder 5. At the tip of the arm 9 is provided a not-shown stopper, which prevents dropout of the closure body 8. Moreover, at the tip of the closure body 8 is provided a lock pawl 8a. By engaging the lock pawl 8a to a lock hole 5b provided on the other side of the battery holder 5, the opening 7 can be closed by the closure body 8 in a tightly closed state.

The opening/closing operation of the closure apparatus for electronics having such a construction is performed in the following manner. First, the closure body 8 closing the opening 7 is slid in parallel to the side of the housing, as shown in an arrow A in FIG. 2. Thereby, the lock pawl 8a of the closure body 8 is released from the lock hole 5b of the battery holder 5, and that makes it possible to open the closure body 8. Then, as shown in an arrow B in FIG. 2, the arm 9 is pivoted centering around the bearing portion 5a in an arc form. Thereby, the opening 7 is opened to change the state of the closure body 8 as shown in FIG. 1, and that makes it possible to insert the battery.

As described above, the closure opening/closing apparatus, for example, a closure opening/closing apparatus for opening/closing an opening where an insert such as a battery for the power supply, a recording medium or the like is detachably inserted in the electronics, can be opened only by 90° to 110° with respect to the housing. Therefore, there is a possibility that the closure body, the shaft or the like may be broken, if a force is forcibly applied to the opening direction. Moreover, since the closure body is opened in a state that it stands against the housing, there is a possibility that the closure may be damaged by being caught by other parts, or may become an obstruction at the time of taking in and out the insert.

To avoid these problems, the closure body or the shaft is made from a soft material, such as polypropylene (PP) or the like. In this case, the appearance becomes different from the housing and the quality is deteriorated. Moreover, this closure body can be reinforced by a sheet metal such as stainless or the like. In this case, since the closure body and the sheet metal are screwed together for fixation, there are such problems that the thickness of the closure increases, that there is a possibility that attachment to the housing may be hindered, and that the cost increases due to the usage of the sheet metal and screws.

SUMMARY OF THE INVENTION

In view of the above situation, it is an object of the present invention to provide a construction that the closure body can be opened in a state that it is reversed with respect to the housing, to thereby solve the above problems.

To attain the above described objects, the closure opening/closing apparatus of electronics according to the present invention comprises a closure body for opening/closing an opening provided in a hardware housing, and a slide hinge intervened between the hardware housing and the closure body and provided with two hinge portions in parallel to each other at a required interval, wherein a hinge holder is so formed that the slide hinge is rotatably supported by means of a shaft on either one side of the hardware housing or the closure body at one hinge portion, while the other hinge portion is slidably and rotatably held on the other side thereof, and that the closure body is rotated in two steps with respect to the housing, by means of a rotation in the two hinge portions due to sliding of the slide hinge, and closes so as to overlap on the outside of the housing in a reversed state.

In the above construction, a spring member for energizing the closure body in the opening direction is disposed. Moreover, this spring member has a spring energizing section corresponding to respective two hinge portions of the slide hinge, and the spring energizing sections are coupled integrally.

Moreover, the present invention has the construction described above, wherein an engagement section is formed where the slide hinge is engaged with the hinge holder in a clicked state.

The closure opening/closing apparatus of electronics of the present invention constructed as described above has such features that the closure body constructed as describe above is opened so as to be overlapped on the outside of the hardware housing in a reversed state with respect to the housing, hence the opening of the hardware housing can be opened large, and even if the closure body is strongly pushed, there is no possibility of being broken.

Moreover, the closure body is automatically opened after releasing the lock, due to the energy of a resilient energizing section of the spring member disposed in two hinge portions of the slide hinge. Furthermore, the spring member has spring energizing sections coupled integrally, corresponding to respective two hinge portions of the slide hinge, hence assembly to the hinge holder is simplified.

Furthermore, by forming an engagement section where the slide hinge is engaged with a hinge holder which slidably holds the slide hinge in a clicked state, click feeling is generated in the sliding operation of the slide hinge at the time of opening/closing operation of the closure body. Hence, the operability is improved, and the engagement state of the closure body can be confirmed by the clicked feeling to improve the ease of use.

DETAILED DESCRIPTION OF THE PREFERRED EMBODIMENT

An embodiment of the present invention will now be described with reference to FIG. 3 to FIG. 16.

This embodiment applies the closure opening/closing apparatus of electronics according to the present invention to a closure of a storage section of a memory stick as a recording medium for a video still camera, using the video still camera as an electronic still camera of the electronics.

Figure 16:
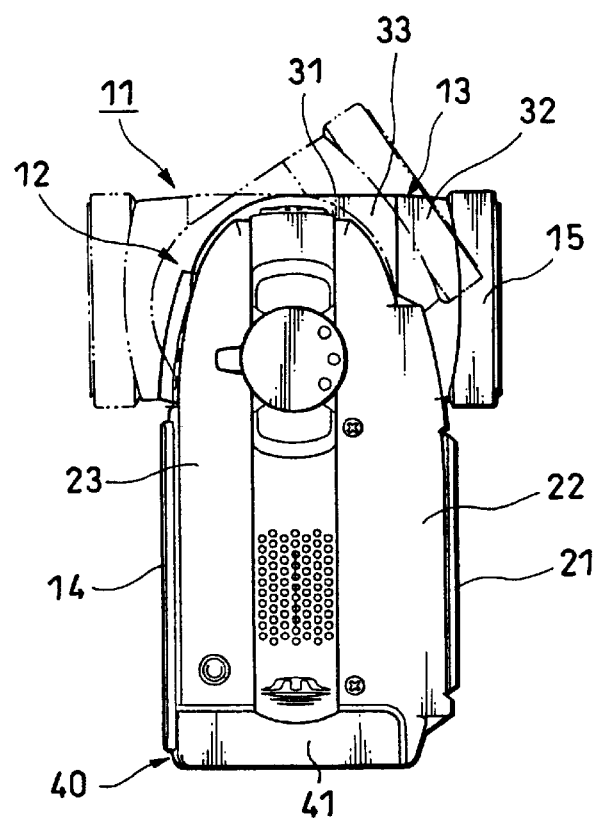
FIG. 16 is a left side view of the video still camera shown in FIG. 14.
Figure 1:
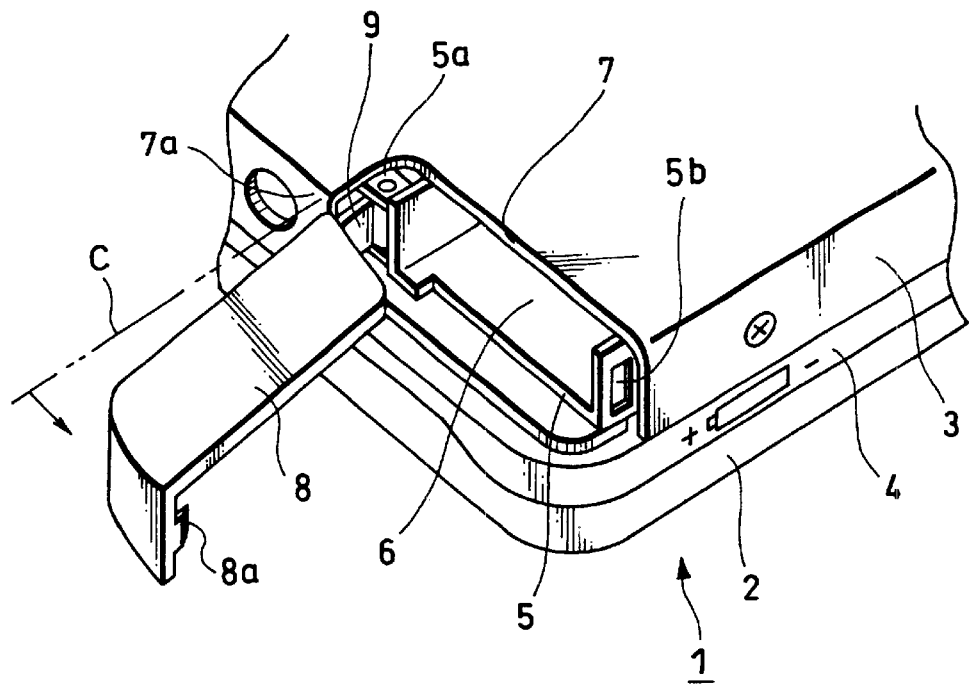
FIG. 1 is a perspective view of a conventional electronics closure opening/closing apparatus in a state that the closure thereof is opened.
Figure 2:
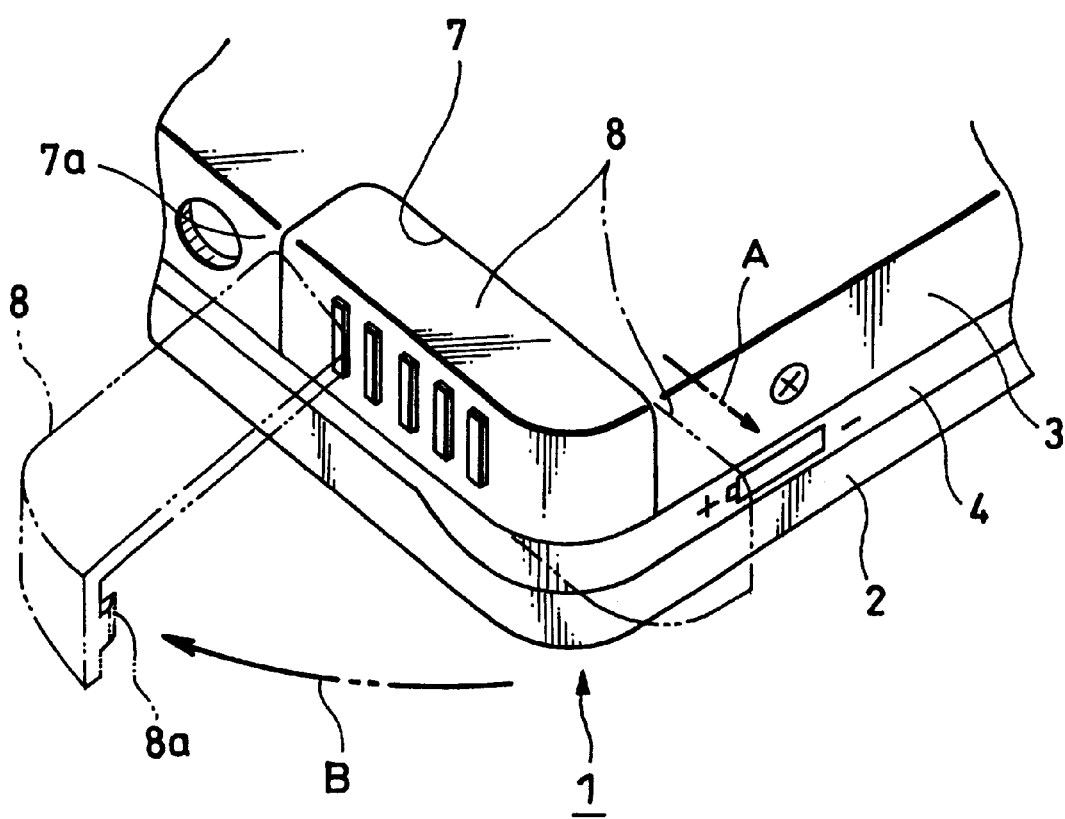
FIG. 2 is a perspective view of the closure opening/closing apparatus shown in FIG. 1 in a state that the closure is closed.
Figure 14:
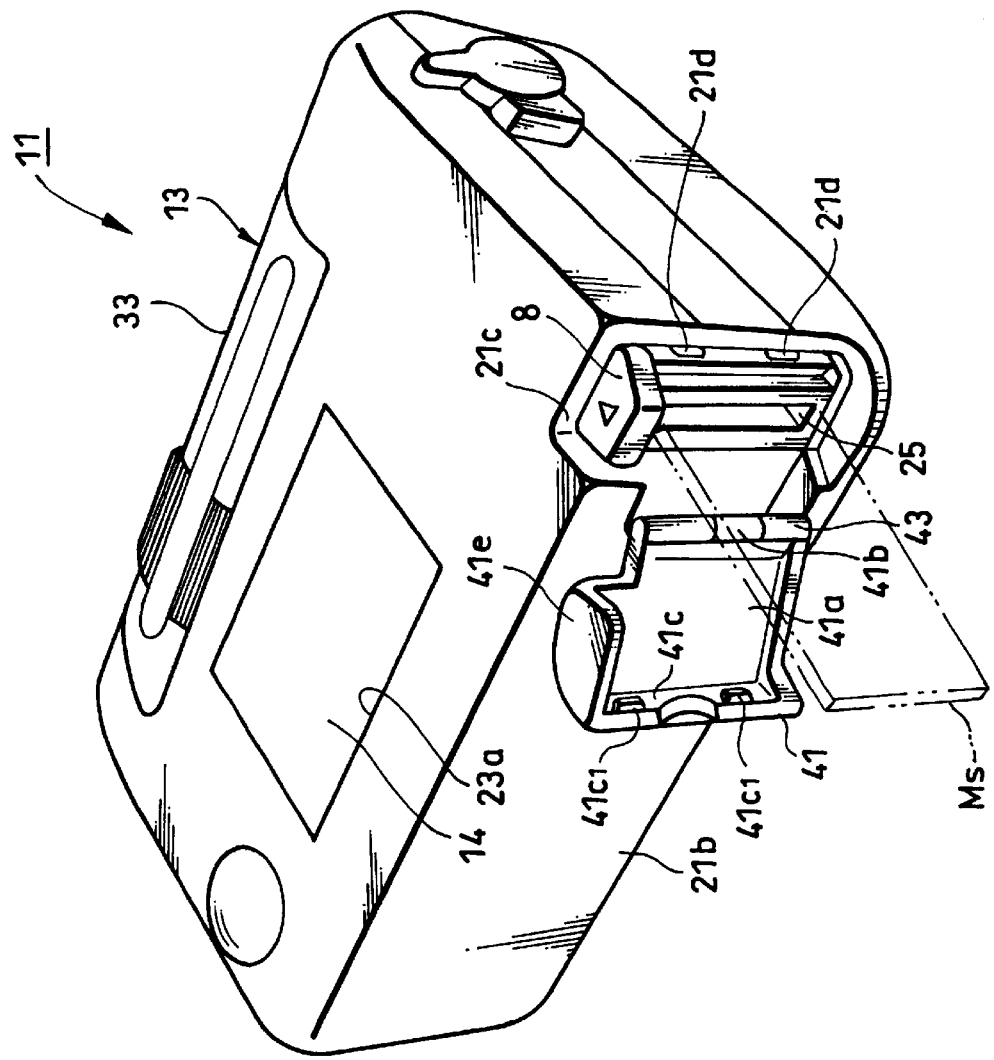
FIG. 14 is a perspective view of one example of a video still camera to which the electronics closure opening/closing apparatus according to the present invention is applied.
Figure 15:
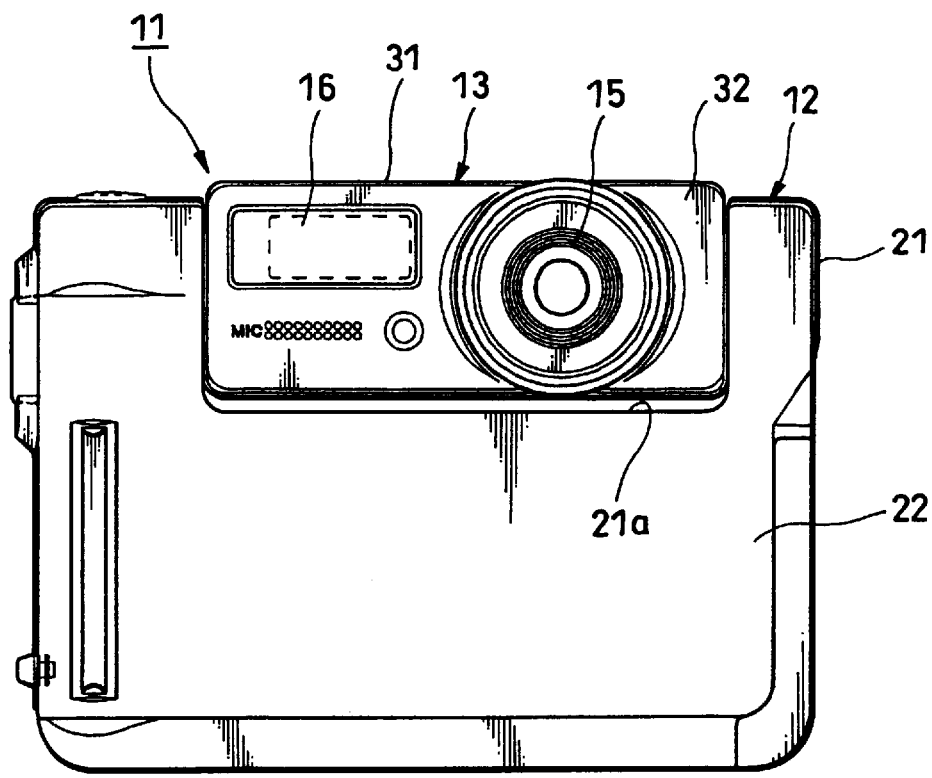
FIG. 15 is an elevation of the video still camera shown in FIG. 14.

FIG. 14 is a rear perspective view of a video still camera in this embodiment, and FIG. 15 is a front view and FIG. 16 is a left side view thereof.

As shown in FIG. 14 to FIG. 16, the video still camera 11 is constructed by assembling a shooting section 13 rotatably back and forth on the upper part of the camera body 12. A recording and reproduction apparatus is built in the camera body 12, and a memory stick Ms, serving as a recording medium, is stored in a state that the memory stick can be freely taken in and out. An image display section 4 is provided in a prescribed location roughly in the middle of the rear side. Moreover, in the shooting section 13, a lens unit 15 and a strobe unit 16 are arranged at a required interval in the lateral direction.

In the camera body 12 of the video still camera 11 constructed as described above, an outer housing 21 is formed by uniting a front panel 22 and a rear panel 23. A recess 21a is formed on the upper part of the outer housing 21, and a screen display window 23b of the image display section 14 is formed roughly in the central portion of the rear side of the rear panel 23. The recording and reproduction apparatus and the image display section 14 are built in the outer housing 21 of the camera body 12 formed in this manner, and the shooting section 13 is attached rotatably back and forth in the recess 21a of the outer housing 21.

The shooting section 13 i s formed by uniting a front cabinet 32 and a rear cabinet 33, with an outer housing 31 being the same width as that of the outer housing 21 of the camera body 12. Cylindrical shaft sections are formed on both sides of the outer housing 31. The cylindrical shaft section of the outer housing 31 is formed by confronting hemi-cylindrical protrusions protruded and formed integrally on both sides of the respective front and rear cabinets 32, 33. The outer housing 31 is fitted by insertion to a bearing hole formed in the both in side portions of the recess 21a of the outer housing 21 of the camera body 12, and supported rotatably back and for th in the recess 21a with respect to the outer housing 21 of the camera body 12.

The shooting section 13 is constituted by fitting and securing a holder in the outer housing 31 of the shooting section 13 and attaching the lens unit 15 and the strobe unit 16.

An insertion opening 25 for loading a memory stick Ms as a recording medium to the built-in recording and reproduction apparatus is formed, located at one corner on the bottom portion 21b side, in the outer housing 21 of the camera body 12 to which the shooting section 13 is attached in this manner, and the closure opening/closing apparatus according to present invention is provided for opening and closing the insertion opening 25.

That is to say, in the outer housing 21 of the camera body 12, there is formed the insertion opening 25, spanning across the bottom portions 22a and 23a of the front panel 22 and the rear panel 23. A closure opening/closing apparatus 40 of one example for opening/closing the insertion opening 25 is provided in a prescribed location at the left corner on the bottom section 21b side of the outer housing 21.

Figure 3:
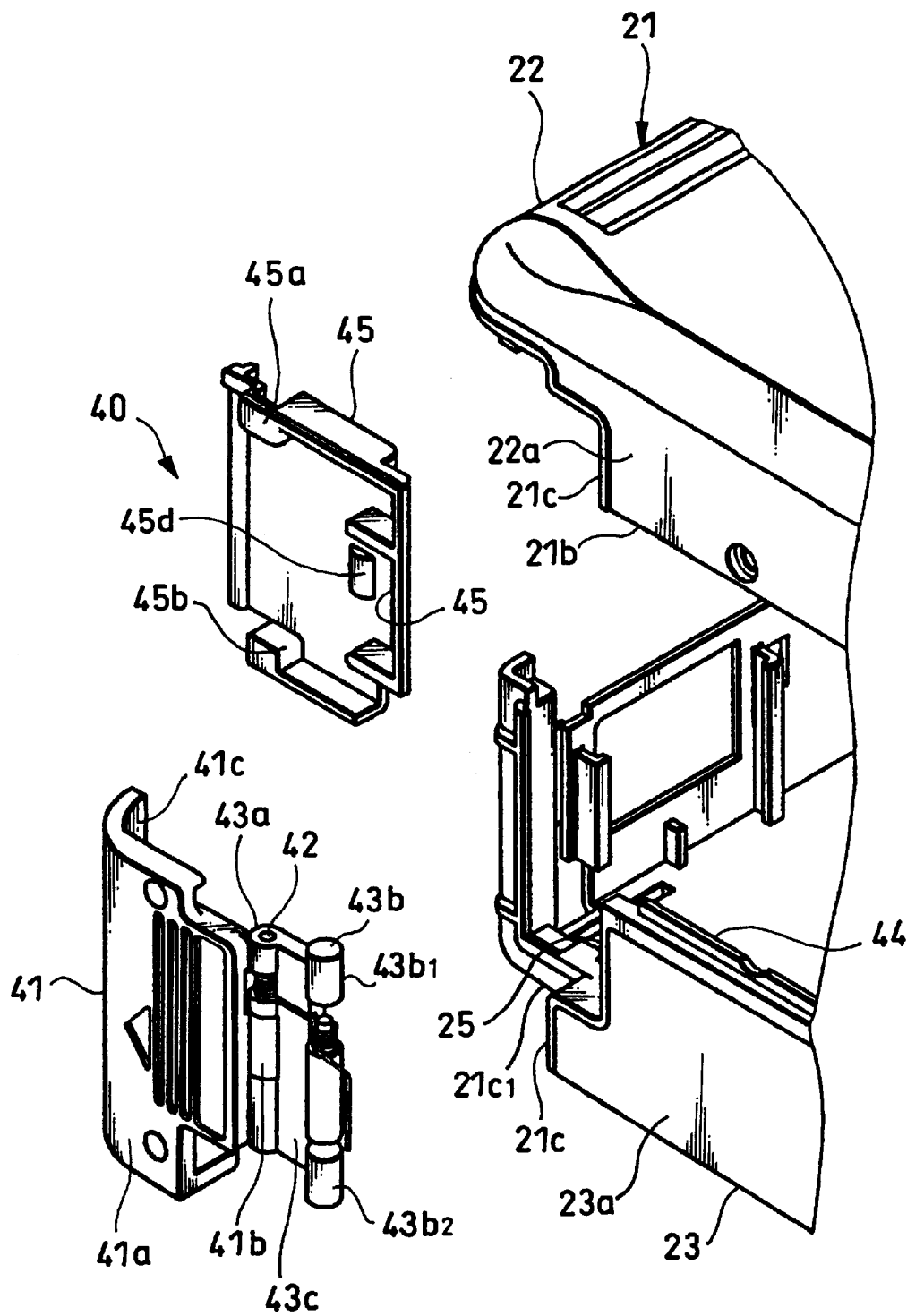
FIG. 3 is an exploded perspective view of one embodiment of the closure opening/closing apparatus of electronics according to the present invention.
Figure 4:
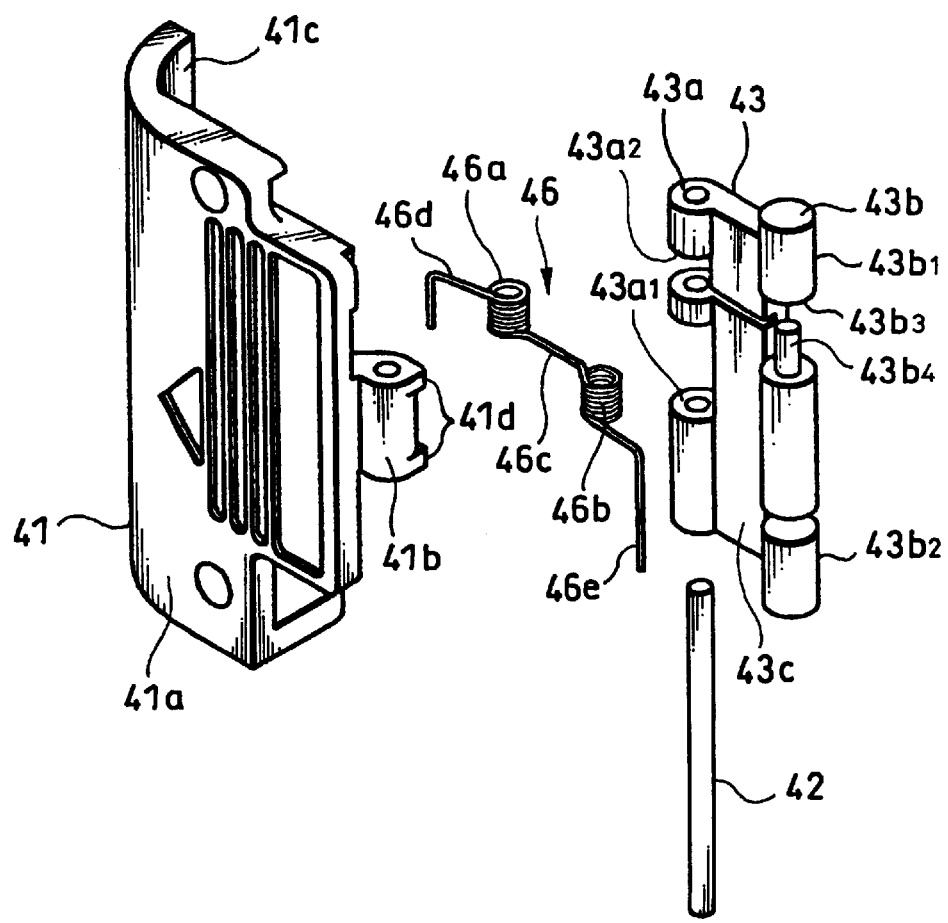
FIG. 4 is an exploded perspective view of a closure portion of the closure opening/closing apparatus shown in FIG. 3.
Figure 5:
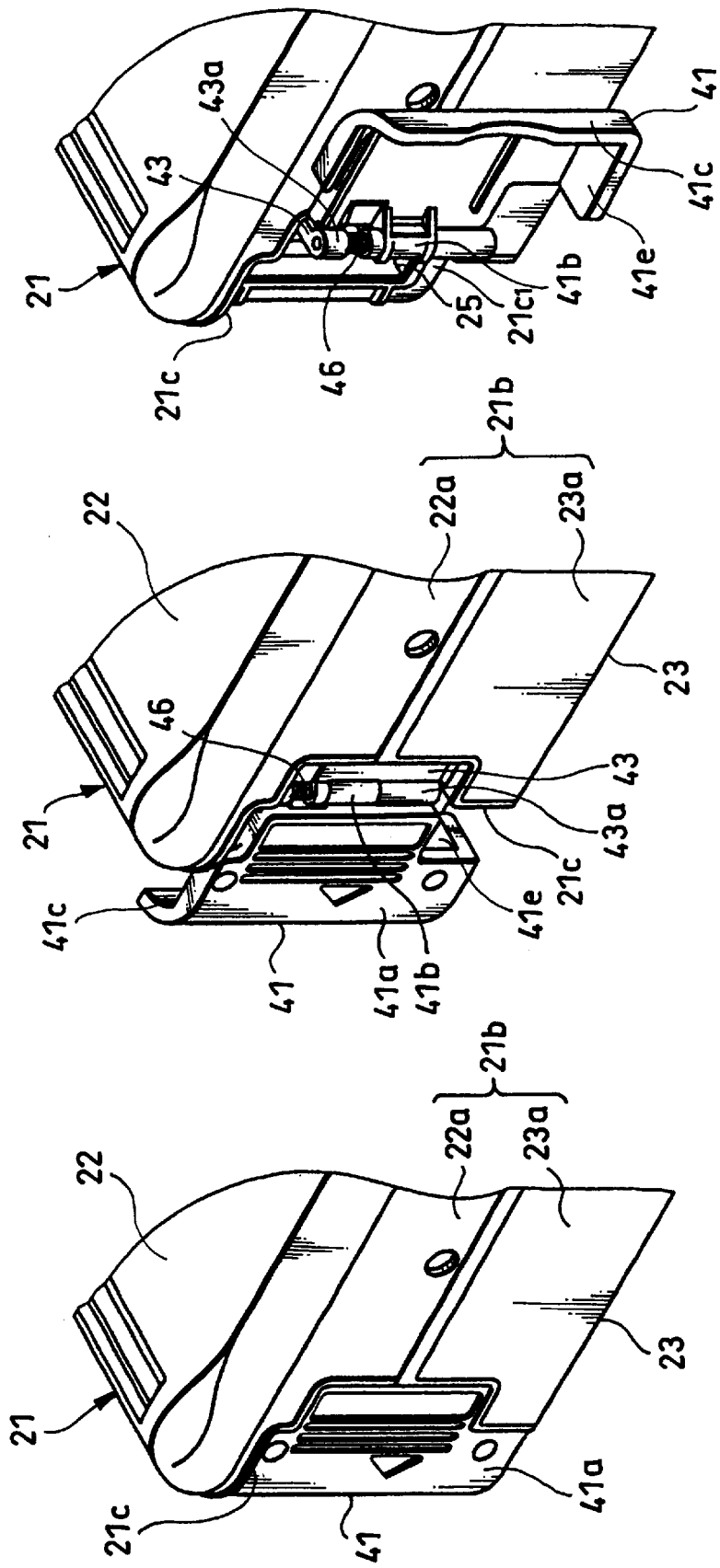
FIG. 5A is a perspective view showing a closed state of the closure opening/closing apparatus shown in FIG. 3.
FIG. 5B is a perspective view showing an intermediate state between opened and closed states in FIG. 3.
FIG. 5C is perspective view showing an opened state.

The closure opening/closing apparatus 40 is constituted by, as shown in FIG. 3 to FIG. 5: a closure body 41 which corresponds to the bottom portion and the left side of the outer housing 21 at the same level, from the bottom portion to the lower part of the left side thereof at the left corner on the bottom portion 21b of the outer housing 21 and closes the insertion opening 25; a slide hinge 43 provided with a first hinge portion 43a supported by a shaft pin 42 in a bearing 41b formed in the middle of the end portion of the bottom portion 41a of the closure body 41, and a second hinge portion 43b parallel to the first hinge 43a at a required interval; a rebound leaf 45 provided in a prescribed location on the inside of the bottom portion 21b of the outer housing 21 and forming a hinge holder 44 of the slide hinge 43 between the bottom portion and itself; and a spring member 46 wound on the first and second hinge portions 43a and 43b of the slide hinge 43 to energize the closure body 41 to pivot outward from the slide hinge 43 and to energize the slide hinge 43 to pivot outward from the hinge holder 44.

The closure body 41 of the closure opening/closing apparatus 40 constructed in this manner is formed roughly in an L shape in section by the bottom portion 41a and a side portion 41c, so as to correspond to a notch opening 21c formed from the bottom portion 21b to the left side in the bottom left side corner of the outer housing 21 of the camera body 12. The bottom portion 41a is formed in a narrower width at the rear half section, and a cylindrical bearing 41b is formed in the middle of the end edge portion. On the outer periphery of the both ends, there are formed protrusions 41d sliding in contact with the rebound leaf 45, and that makes it possible to rotate the closure body 41 smoothly.

Moreover, on the front half section of the bottom portion 41a and the rear edge side of the side portion 41b of the closure body 41, there is formed a blocking section 41e corresponding to an operation section 21c, formed in a notch to operate a discharge operation button 18 of the memory stick Ms, at a corner on the rear side of the outer housing 21, that is, at the left corner on the lower end side of the rear section of the rear panel 23.

Furthermore, in the slide hinge 43, a first hinge portion 43a is formed in a cylindrical shape, and there are also formed a notch opening 43a, in which the first hinge portion 43a communicates with and is fitted together by insertion into the bearing 41b of the closure body 41 in the axial direction, and a notch recess $43a_2$ into which one coil portion described below of the spring member 46 is fitted together by insertion. Moreover, the second hinge portion 43b is in a columnar shape and both end shafts $43b_1$, $43b_2$ project from the both end faces on a flat portion 43c of the slide hinge 43. In the central portion thereof, a recess $43b_3$ is formed in a width twice as wide as the length of the coil section, to which the other coil section described below of the spring member 16 is inserted, and a shaft protrusion $43b_4$ to which the coil portion is fitted together by insertion is axially protrudes on one of the inside portions. On the flat portion 43c, a groove engaging with a guide rib provided in the rebound leaf 45 is formed.

Figure 6:
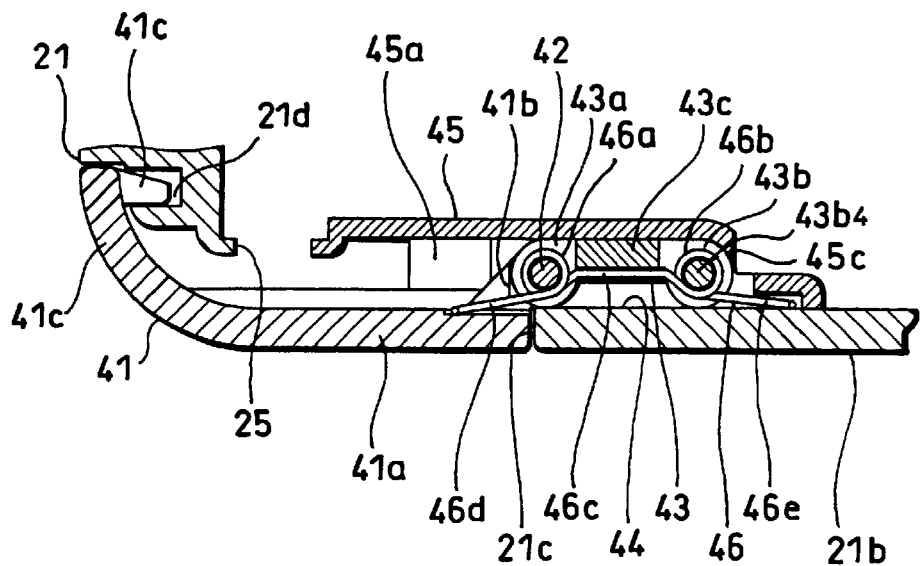
FIG. 6 is an enlarged sectional view of one side portion of the closure opening/closing apparatus shown in FIG. 3, in a closed state.

The flat portion 43c which is a flat interval portion between the first hinge 43a and the second hinge 43b is formed in a width substantially equal to or slightly larger than a size adding the thickness of the bottom portion of the outer housing 21 and the thickness of the closure body 41, and on the inside of the flat portion 43c facing to the rebound leaf 45 is formed a recess $43c_1$ roughly corresponding to the middle of the second hinge 43b (see FIG. 6).

In the rebound leaf 45, furthermore, engaging protrusions 45a, 45b, with which the both end shafts $43b_1$, $43b_2$ of the second hinge portion 43b of the slide hinge 43 engage, are formed by protrusion on the both sides of the outer end portion of the sliding side of the slide hinge 43. Moreover, on the inner end portion is formed an engaging protrusion edge 45c with which the hinge portion 43b of the slide hinge 43 engages, and on the forward side of the engaging protrusion edge 45c, a protrusion 45d for holding the second hinge portion 43b of the slide hinge 43 together with the engaging protrusion edge 45c is formed by protrusion in a convex arc form in section.

Furthermore, the spring member 46 fits, to the slide hinge 43, the first coil portion 46a by insertion in the notch recess $43a_2$ of the first hinge portion 43a, and inserts and pivotally supports the second coil portion 46b into the shaft protrusion $43b_4$ of the recess $43b_3$ of the second hinge portion 43b, with a torsion spring having two coils portions 46a and 46b as the resilient energizing section, and a coupling arm 46c between the first and the second coil portions 46a and 46b is abutted against the flat section 43c of the slide hinge 43. Then, an arm 46d on the first coil portion 46a side of the spring member 46 is resiliently abutted against the inside of the closure body 41, and an arm 46e on the second coil section 46b is resiliently abutted against the inside of the bottom portion 21b of the outer housing 21 opposite to the slide hinge 43, which is inside of the slide holder 44.

Each member of the closure opening/closing apparatus 40 is formed as described above, and the closure opening/closing apparatus 40 is assembled with each member. That is to say, the bearing 41b of the closure body 41 is fitted by insertion to the notch opening $43a_1$ of the first hinge portion 43a of the slide hinge 43 so that the respective shaft holes of the bearing 41c and the first hinge 43a communicate to each other, to thereby pass the shaft pin 42 therethrough. This shaft pin 42 rotatably connects the closure body 41 and the slide hinge 43 to each other by means of a shaft by passing through the first coil portion 46a of the spring member 46 at the notch recess $43a_2$ of the first hinge portion 43a. In this state, the coupling arm 46c of the spring member 46 resiliently abuts against the flat portion 43c of the slide hinge 43, and the first arm 46d resiliently abuts against the inside of the closure body 41, to thereby energize rotatably the closure body 41 and the slide hinge 43 to each other.

Then, the inside of the slide hinge 43 faces the rebound leaf 45, so that the second hinge portion 43b is located between the engaging protrusions 45a, 45b of the rebound leaf 45 and the engaging protrusion edge 45c.

In this state, the hinge holder 44 is formed by securing the rebound leaf 45 at the inner end of the bottom portion 21b of the outer housing 21, with the outer end portion facing the notch opening 21c. In this state, the second arm 46e of the spring member 46 is resiliently abutted against the inside of the bottom portion 21b of the outer housing 21.

Figure 10:
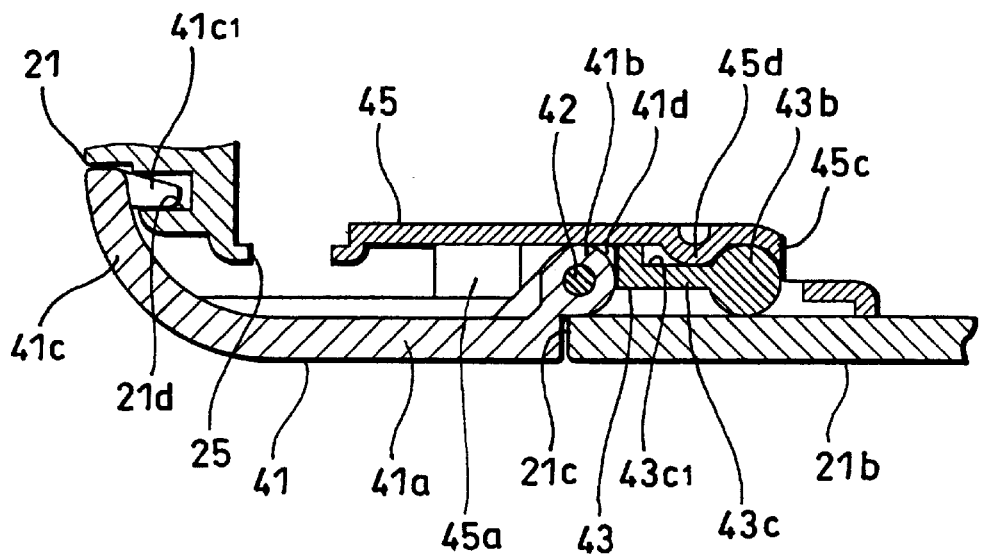
FIG. 10 is a central longitudinally sectional view showing a state that the closure opening/closing apparatus shown in FIG. 3 is closed.

As described above, the assembled closure opening/closing apparatus 40 is held in such a manner that in the state that the closure body 41 is fitted to the notch opening 21c of the outer housing 21, as shown in FIG. 6, and the inside of the tip portion, that is, engaging protrusion $41c_1$ on the inside of the tip portion of the side portion 41c is engaged with the engaging portion 21d of the outer housing 21 from outside, to thereby block the insertion port 25 of the memory stick Ms, the slide hinge 43 is slid and positioned at the innermost side of the hinge holder 44, that is, at the inner end of the rebound leaf 45, and as shown in FIG. 10, the second hinge portion 43b is fitted between the engaging protrusion 45c and the protrusion 45d on the rebound leaf 45 side, at a portion where the second hinge portion 43b faces the recess $43c_1$.

Figure 7:
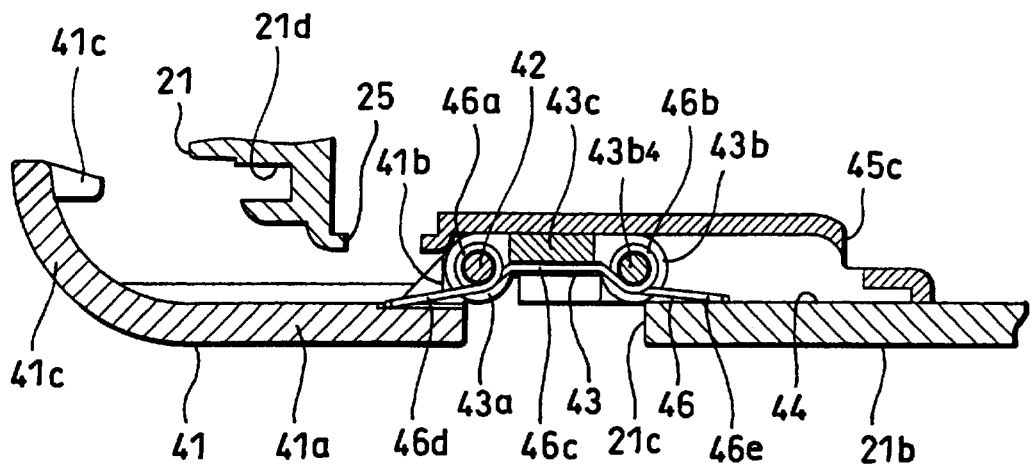
FIG. 7 is an enlarged sectional view of the same part in the opening starting state.
Figure 11:
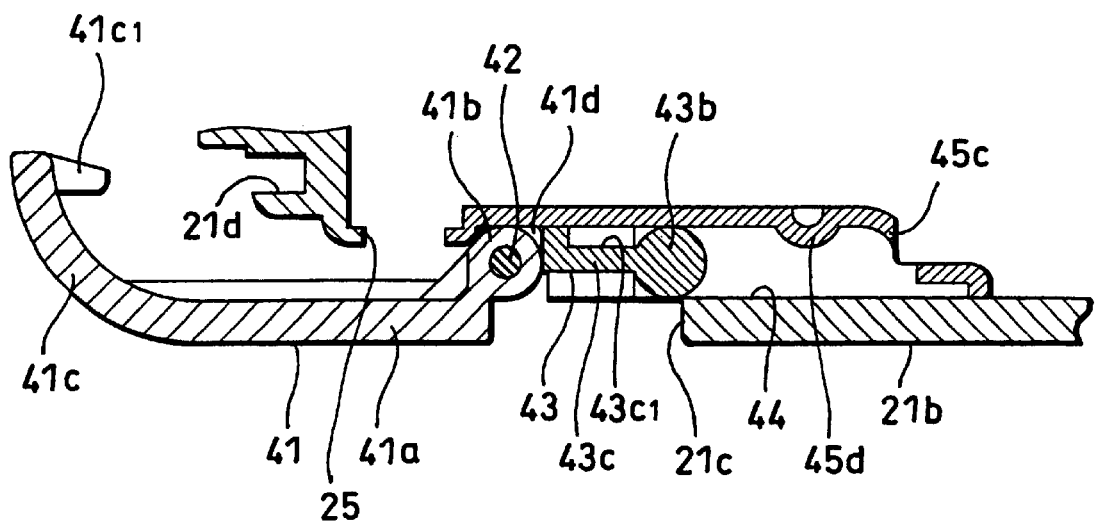
FIG. 11 is an enlarged central longitudinally sectional view showing a state that the closure opening/closing apparatus is beginning to be opened.

The blocked state of the insertion port 25 is released by means of the closure body 41 in the following manner. As shown in FIG. 7 and FIG. 11, when the closure body 41 is pushed out in parallel along the bottom portion 21d of the outer housing 21, the second hinge portion 43b of the slide hinge 43 also slides together with the closure body 41, climbing over the protrusion 15d on the rebound leaf 15 side. Moreover, the engaging protrusion $41c_1$ on the inside of the tip portion of the closure body 41 is released from the engaging portion 21b of the outer housing 21 to thereby release their engagement, while both end shafts $43b_1$, $43b_2$ of the second hinge 43b of the slide hinge 43 are engaged with the engaging protrusions 15a, 15b on the outer end side of the rebound leaf 15, as shown in FIG. 11.

Figure 8:
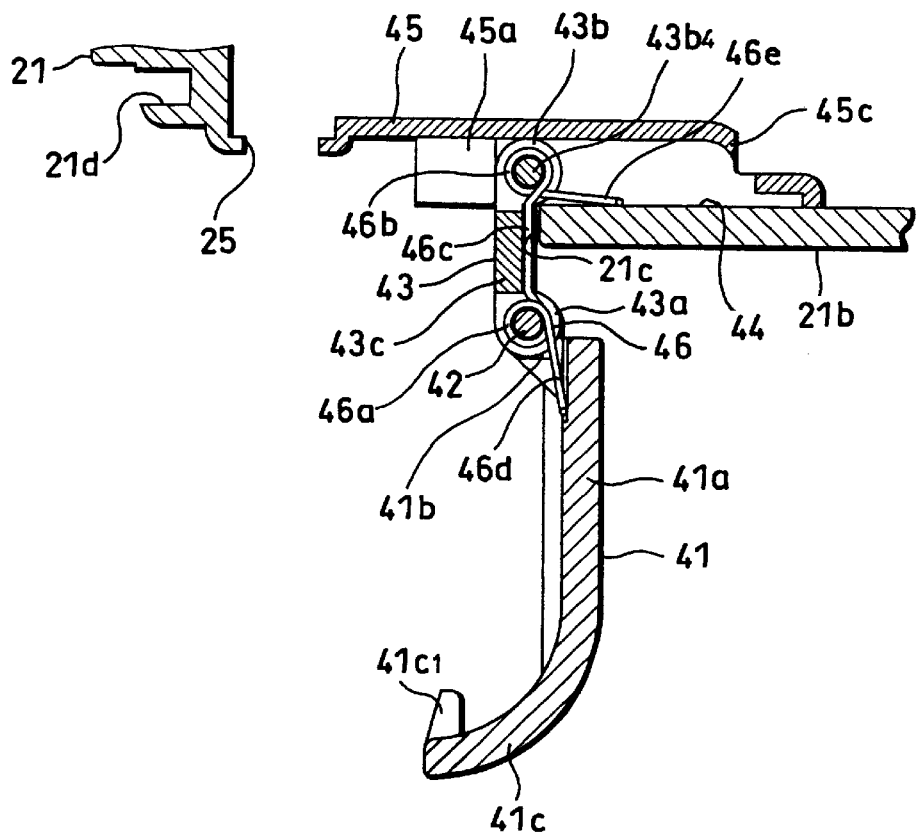
FIG. 8 is an enlarged sectional view of the same part in the middle of the opening state.
Figure 12:
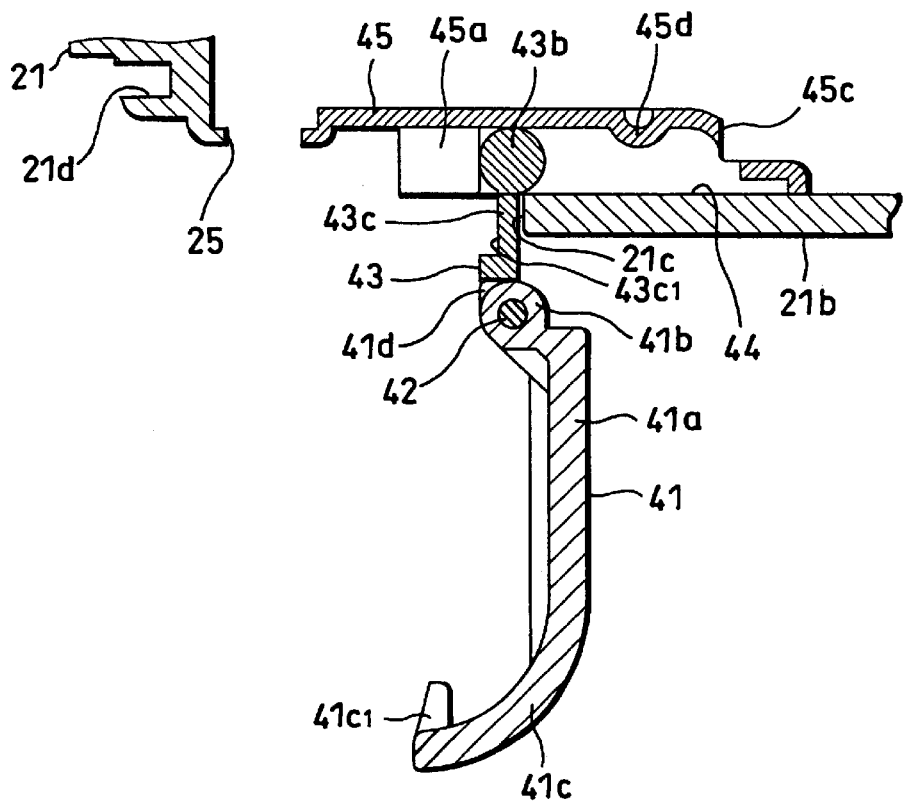
FIG. 12 is an enlarged central longitudinally sectional view showing a state that the closure opening/closing apparatus is in the middle to be opened.

If the pressure on the closure body 41 is released in this state, the closure body 41 pivots in the vertical direction around the second hinge portion 43b of the slide hinge 43 together with the slide hinge 43, due to the torsion resilience of the second coil portion 46b of the spring member 46, as shown in FIG. 8 and FIG. 12, so that the flat portion 43c of the slide hinge 43 is abutted against the end face of the bottom of the notch opening 21c of the outer housing 21 and caught and held by the end face roughly at the right angle position. In this state, the closure body 41 is pivoted, as shown in FIG. 9 and FIG. 13, outward in the reversed and turned down direction, centering around the first hinge portion 43a of the slide hinge 43, due to the torsion resilience of the first coil portion 46a of the spring member 46.

Figure 9:
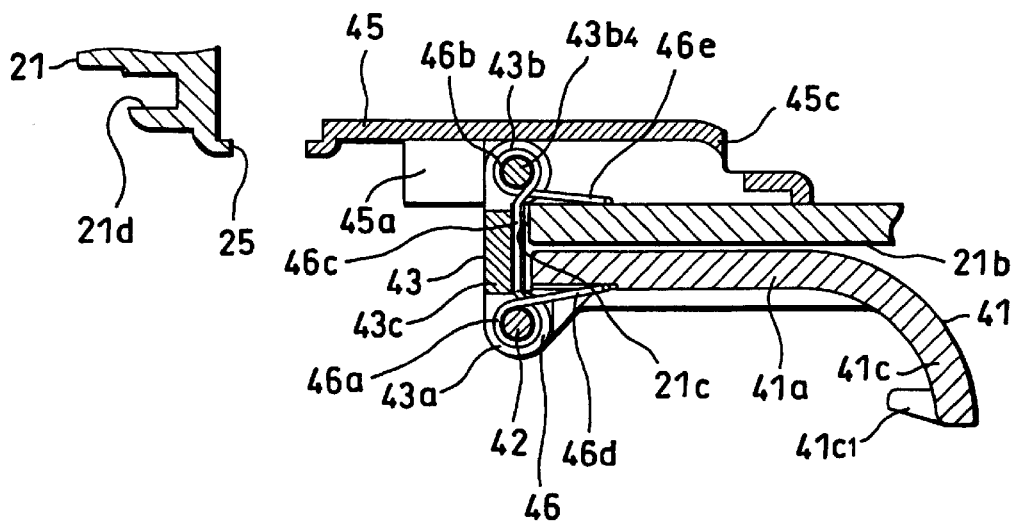
FIG. 9 is an enlarged sectional view of the same part in the opening completed state.
Figure 13:
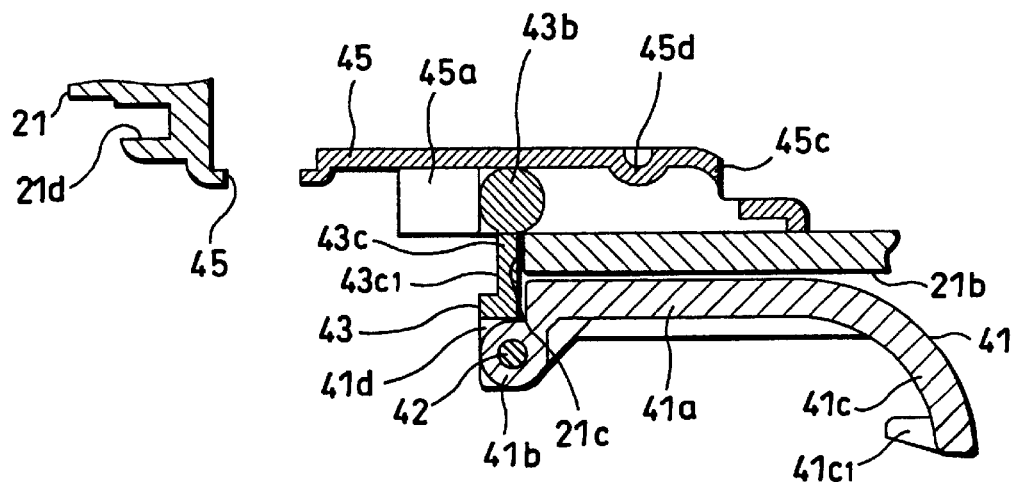
FIG. 13 is an enlarged central longitudinally sectional view showing a state that the closure opening/closing apparatus is completely opened.

Hence, the closure body 41 is reversed in a turned down state and overlapped on the outside of the bottom portion 21b of the outer housing 21, as shown in FIG. 9 and FIG. 13. The notch opening 21c of the outer housing 21 is largely and completely opened to expose and open the insertion port 25 of the memory stick Ms.

Moreover, to close the closure body 41 from its opened state, the operation is as follows. If the closure body 41 is pushed in the direction of raising the closure body 41, the slide hinge 43 is turned down and rotated, centering around the second hinge portion 43b together with the closure body 41, against the torsion resilience of the second coil portion 46b of the spring member 46, and positioned in parallel to the rebound leaf 45. In this state, if the closure body 41 is pushed further, the closure body 41 is reversed and turned down, centering around the first hinge portion 43a of the slide hinge 43, against the torsion resilience of the first coil portion 46a of the spring member 46, toward the notch opening 21a of the outer housing 21. This pivotal movement of the closure body 31 is smoothly performed by the abutment of the protrusion 41d formed on the outer periphery of the bearing 41b of the rear end portion of the closure body 41 against the flat portion of the rebound leaf 45.

Then, when the closure body 41 is pushed into the notch opening 21c in parallel thereto, in the state that the closure body 41 is pivoted and turned down on the same level with the bottom portion 21b of the outer housing 21, the slide hinge 43 slides inward of the hinge holder 44, that is, backward along the plate face of the rebound leaf 45, and the central portion of the second hinge 43b climbs over the protrusion 45d of the rebound leaf 45 and fitted and held between the protrusion 45d and the engaging protrusions 45c. At the same time, the engaging protrusion 41b on the inside of the tip portion of the closure body 41 is engaged with the engaging portion 21d of the outer housing 21 from outside, and locked with respect to the outer housing 21, to close the notch opening 21c. Thus, as shown in FIG. 6 and FIG. 10, the insertion port 25 is blocked.

In this embodiment, as described above, the closure body 41 of the closure opening/closing apparatus 40 comprises the slide hinge 43 having the first and second hinge portions 43a and 43b parallel to each other, and is pivoted for the opening/closing operation at the two hinge portions 43a and 43b of the slide hinge 43 with respect to the outer housing 21. Hence, the opening operation is performed in a reversed state, and the opening 21a of the outer housing 21 can be opened largely. Then, by attaching the spring member 46 to the first and second hinge portions 43a and 43b, the opening operation of the closure body 41 can be automatically performed by means of the torsion resilience of the first and second coil portions 46a and 46b of the spring member 46, after releasing the engagement of the closure body 41. The closure body 41 is then held in the state that the opening 21c of the outer housing 21 is opened.

Moreover, the torsion spring as the spring member 46 provided in a prescribed location in the first and second hinge portions 43a and 43b of the slide hinge 43 is formed integrally in a so-called eyeglasses shape, with the first coil portion 46a attached to the first hinge portion 43a and the second coil portion 46b attached to the second hinge portion 43b being disposed with an interval by means of one wire. Hence, the structure thereof is simplified, as well as the assembly to the slide hinge 43 is performed easily.

Furthermore, with the closure body 41 of this embodiment, the structure may be such that the spring member 46 is not provided in the slide hinge 43 in the closure opening/closing apparatus 40. In this case, the opening/closing operation of the closure body 41 is performed all by hand. That is to say, as for the opening operation of the closure body 41, in the state that the closure body 41 is pushed out in parallel to the bottom portion 21b of the outer housing 21, the closure body 41 is raised and pivoted in the vertical direction, centering around the first hinge portion 43a with respect to the slide hinge 43 which is slid together with the closure body 41 and pushed backward. Thereby, the slide hinge 43 is raised and rotated, centering around the second hinge portion 43b, and the closure body 41 is turned down and overlapped on the outside of the bottom portion of the 21b of the outer housing 21, to thereby open the opening 21a of the outer housing 21 largely.

Furthermore, when the closure body 41 is closed from the opened state, the notch opening 21c of the outer housing 21 can be closed in the same manner as described above. In this case, since the closure body 41 is not provided with the spring member 46 to the slide hinge 43, the closing operation of the closure body 41 can be performed smoothly.

As described above, the embodiment of the present invention has been described, but the present invention is not limited to this embodiment, and various changes and modifications can be made without departing from the scope of the present invention.

For example, the shape and the like of the closure body can be changed optionally in accordance with the shape of the opening to be blocked. Moreover, the shape and structure of the slide hinge can be also changed optionally, so long as the slide hinge has two hinge portions parallel to each other.

The above described embodiment is so constructed that a slide hinge having two first and second hinge portions parallel to each other is provided slidably on the outer housing side, and a closure body is pivotally supported by the first hinge portion which is one of the two hinge portions. However, the construction may be such that the slide hinge is provided slidably on the closure body side, and one of the hinge portions, that is, the first or the second hinge portion is pivotally supported on the outer housing side. Also in this case, the closure body can be reversed and opened with respect to the outer housing. Moreover, in this case, a rebound leaf similar to the aforementioned embodiment is attached on the inside of the closure body to form a hinge holder for holding the slide hinge. In this case, for example, in the case of a battery case, the inside of the rebound leaf can be constructed as a contact terminal plate.

The closure opening/closing apparatus according to the present invention can be applied not only to closures for opening/closing article storage sections in electronics, such as a storage section for a memory stick for a video still camera, a battery storage section and the like, but also to closures for opening/closing various hardware and various storage boxes.

According to the present invention, the closure opening/closing apparatus comprises: a closure body for opening/ closing an opening provided in a housing; and a slide hinge intervened between the housing and the closure body, and provided with two hinge portions in parallel to each other at a required interval; wherein it is so constructed that the slide hinge is rotatably supported by means of a shaft on either one side of the closure body or the housing at one hinge portion, while being slidably and rotatably held on the other side thereof; and that the closure body is rotated in two steps with respect to the housing, by means of a rotation in the two hinge portions due to sliding of the slide hinge, and opens so as to overlap on the outside of the housing in a reversed state. Hence, the opening of the housing is substantially completely opened to make it easy to take in and out an insert, while there is no possibility that the closure body may be broken, even if the closure body is carelessly pushed in an opened state. Therefore, it is not necessary to form the closure body with a sheet plate or the like having high strength, and that makes it possible to reduce the cost. Moreover, the bearing structure is also simplified, to thereby increase the freedom of design, while saving the space.

Moreover, by disposing a spring member for energizing the closure body in the opening direction in two hinge portions of the slide hinge, the opening operation of the closure body can be automatically performed, while the closure body is held in a completely opened state, hence taking in and out of the insert to/from the opening can be done very easily with only one hand. Furthermore, the spring member has a spring energizing section corresponding to respective two hinge portions of the slide hinge, and by integrally coupling the ends of the spring energizing sections, incorporation of the spring member to the slide hinge is simplified, to thereby increase the workability as well as to make the production and control of the spring member itself easy.

Furthermore, by forming an engagement section in the hinge holder, a click feeling is generated in the sliding operation of the slide hinge. Hence, the operability is improved, and the engagement state of the closure body can be confirmed by the clicked feeling.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A device for opening/closing a lid of an electronic apparatus, the device comprising:

a lid body for opening/closing an opening disposed on a hardware housing of said electronic apparatus;

a slide hinge interposed between said hardware housing and said lid body and including first and second hinge portions in parallel to each other with a flat portion formed therebetween; and a hinge holder formed of an inner surface of said hardware housing and a rebound leaf spaced apart from said inner surface so that said slide hinge is slidably supported thereby, said slide hinge being rotatably attached to said lid body at said first hinge portion by a shaft attaching said slide hinge and said lid body and said second hinge portion includes columnar end portions arranged so as to be slidably and rotatably held by said hinge holder, wherein said lid body is rotated in two steps with respect to said hardware housing by a rotation of said first and second hinge portions due to sliding of said slide hinge in said hinge holder and opens so as to overlap on an outside of said hardware housing in a reversed state.

2. The device for opening/closing a lid of an electronic apparatus according to claim 1, further comprising a spring member for biasing said lid body in an opening direction disposed in said first and second hinge portions of said slide hinge.

3. The device for opening/closing a lid of an electronic apparatus according to claim 2, wherein said spring member includes a pair of spring energizing sections corresponding respectively to said first and second hinge portions of said slide hinge, wherein said spring energizing sections are coupled integrally.

4. The device for opening/closing a lid of an electronic apparatus according to claim 1, further comprising an engagement section whereat said slide hinge is engaged with said hinge holder in a clicked state.

5. An electronic apparatus provided with a device for opening/closing a lid thereof, said device comprising:

a lid body for opening/closing an opening disposed on a hardware housing of said electronic apparatus;

a slide hinge interposed between said hardware housing and said lid body and including first and second hinge portions in parallel to each other with a flat portion formed therebetween; and a hinge holder formed of an inner surface of said hardware housing and a rebound leaf spaced apart from said inner surface so that said slide hinge is slidably supported thereby, said slide hinge being rotatably attached to said lid body at said first hinge portion by a shaft attaching said slide hinge and said lid body and said second hinge portion includes columnar end portions arranged so as to be slidably and rotatably held by said hinge holder, wherein said lid body is rotated in two steps with respect to said hardware housing by a rotation of said first and second hinge portions due to sliding of said slide hinge in said hinge holder and opens so as to overlap on an outside of said hardware housing in a reversed state.

6. The electronic apparatus according to claim 5, further comprising a spring member for biasing said lid body in an opening direction disposed in said first and second hinge portions of said slide hinge.

7. The electronics apparatus according to claim 6, wherein said spring member includes a pair of spring energizing sections corresponding respectively to said first and second hinge portions of said slide hinge, wherein said spring energizing sections are coupled integrally.

8. The electronic apparatus according to claim 5, further comprising an engagement section whereat said slide hinge is engaged with said hinge holder in a clicked state.

* * * * *